(12) United States Patent
Thomas et al.

(10) Patent No.: US 8,787,053 B2
(45) Date of Patent: Jul. 22, 2014

(54) CLOSE CONTROL OF ELECTRIC POWER CONVERTERS

(75) Inventors: Philippe Thomas, Rungis (FR);
Jean-Michel Jarrousse, Dissay (FR);
Eric Laboure, Cachan (FR)

(73) Assignee: Thales, Neuilly-sur-Seine (FR)

( * ) Notice: Subject to any disclaimer, the term of this patent is extended or adjusted under 35 U.S.C. 154(b) by 449 days.

(21) Appl. No.: 12/066,101

(22) PCT Filed: Aug. 30, 2006

(86) PCT No.: PCT/EP2006/065834
§ 371 (c)(1),
(2), (4) Date: Aug. 5, 2008

(87) PCT Pub. No.: WO2007/028745
PCT Pub. Date: Mar. 15, 2007

(65) Prior Publication Data
US 2008/0310204 A1 Dec. 18, 2008

(30) Foreign Application Priority Data

Sep. 9, 2005 (FR) ...................................... 05 09225

(51) Int. Cl.
*H02M 7/537* (2006.01)
*H02M 1/08* (2006.01)
*H03K 17/041* (2006.01)
*H02M 3/335* (2006.01)

(52) U.S. Cl.
CPC .............................. *H03K 17/04106* (2013.01);
*H02M 1/08* (2013.01)
USPC ........................................ 363/131; 363/21.12

(58) Field of Classification Search
USPC .......... 323/251, 252, 262; 363/16, 17, 97, 98, 363/125, 126, 131, 132, 21.04, 21.12; 361/91.7
See application file for complete search history.

(56) References Cited

U.S. PATENT DOCUMENTS 5,438,294 A * 8/1995 Smith ........................... 327/384
5,498,914 A * 3/1996 De Boer ....................... 307/116

(Continued)

FOREIGN PATENT DOCUMENTS

DE 44 41 492 5/1996
EP 1 063 771 12/2000

OTHER PUBLICATIONS

Joyce, J. M. et al. "Current-Mode Regenerative Gate Drive for Power Field-Effect Transistors." IBM Technical Disclosure Bulletin, IBM Corp. New York, US, vol. 26, No. 5, Oct. 1983, pp. 2246-2248, XP002132629, ISSN: 0018-8689.

*Primary Examiner* — Adolf Berhane
*Assistant Examiner* — Jeffrey Gblende
(74) *Attorney, Agent, or Firm* — Lowe Hauptman & Ham, LLP

(57) ABSTRACT

A close control of electric power converters includes a diode $D_1$ in parallel with a switch $I_1$; a diode $D_2$ in parallel with a switch $I_2$; a transformer ($T_1$). The switches ($I_1$, $I_2$) are controlled, cyclically repeating the following stages: at a time $T_0$ the switch $I_1$ is switched on; at a time $T_1$ the switch $I_1$ is switched off; the switch $I_2$ is switched on before the current passing through the diode $D_2$ reaches zero; at a time $T_3$ the switch $I_2$ is switched off; and at a time $T_4$, when the diode $D_1$ becomes conductive, the first stage is returned to. In particular, the close control of electric power converters relates to electrically isolated electric power supplies working at high frequency with high efficiency and a high level of integration.

6 Claims, 5 Drawing Sheets

(56) References Cited

U.S. PATENT DOCUMENTS

| | | | |
|---|---|---|---|
| 5,959,438 A * | 9/1999 | Jovanovic et al. | 323/222 |
| 6,724,830 B2 * | 4/2004 | Do et al. | 375/295 |
| 2003/0031037 A1 * | 2/2003 | Piaskowski | 363/125 |
| 2003/0063482 A1 | 4/2003 | Carsten | |
| 2004/0145357 A1 * | 7/2004 | Lynch et al. | 323/208 |

* cited by examiner

CLOSE CONTROL OF ELECTRIC POWER CONVERTERS

CROSS-REFERENCE TO RELATED APPLICATIONS

The present Application is based on International Application No. PCT/EP2006/065834, filed on Aug. 30, 2006, which in turn corresponds to French Application No. 05 09225, filed on Sep. 9, 2005, and priority is hereby claimed under 35 USC §119 based on these applications. Each of these applications are hereby incorporated by reference in their entirety into the present application.

FIELD OF THE INVENTION

The invention relates to a close control of electric power converters. In particular, the invention relates to electrically isolated electric power supplies working at high frequency with high efficiency and a high level of integration. In addition, the invention can be used to control bridge converters, found notably in inverters.

BACKGROUND OF THE INVENTION

Switched mode electric power supplies must respond notably to various integration constraints, which include volume, weight or heat dissipation constraints. One solution allowing the volume and the weight of a switched mode electric power supply to be reduced is to decrease the area occupied by the magnetic circuits, and notably the transformer, while increasing the working frequency of these magnetic circuits.

When the working frequency of the magnetic circuits becomes high, that is higher than one megahertz, switched mode electric power supplies must then use a control comprising components that withstand high frequencies. This implies the use of new types of components, such as, for example, new generation MOS transistors. The use of such components forces a rethink of the arrangement of the electric circuits and may have a noticeable impact on the cost of manufacture, production and industrialization.

Another solution allowing the working frequency of the magnetic circuits to be increased is to use voltage controlled components (MOS technology components, insulated gate bipolar transistor etc.) having a high gate capacity. However, this solution generates an increase in heat dissipation as a function of the working frequency of the magnetic circuits. As a result of this, the efficiency of such a solution is never better than 90%. This solution is unsuited for low power power supplies (that is, power supplies of several tens of watts).

SUMMARY OF THE INVENTION

The invention aims notably to overcome the aforementioned drawbacks. To this end, the subject of the invention is a close control providing a control voltage to at least one electric power converter, receiving a continuous input voltage between a point A and a point B. It comprises:
  a diode $D_1$ in parallel with a switch $I_1$, the anode of the diode $D_1$ being connected to point B, the cathode of the diode $D_1$ being connected to a point E;
  a diode $D_2$ in parallel with a switch $I_2$, the anode of the diode $D_2$ being connected to point B, the cathode of the diode $D_2$ being connected to a point F;
  a transformer $T_1$ comprising a first primary coil $E_1$ connected between point A and a point G, a second primary coil $E_2$ connected between point A and the point F, a secondary coil $E_3$, said transformer $T_1$ providing a voltage between a point H and a point D;

The point E and the point G are electrically connected. The point H and the point C are electrically connected. The switches $I_1$ and $I_2$ are controlled, cyclically repeating the following stages:
  at a time $T_0$ the switch $I_1$ is switched on;
  at a time $T_1$ the switch $I_1$ is switched off;
  the switch $I_2$ is switched on before the current passing through the diode $D_2$ reaches zero;
  at a time $T_3$ the switch $I_2$ is switched off; and
  at a time $T_4$, when the diode $D_1$ becomes conductive, the first stape is returned to.

In one embodiment the point E is connected to the point G by a capacitor $C_1$.

In another embodiment the point H is connected to point C by a capacitor ($C_2$).

In another embodiment a diode $D_3$ is connected between the point C and the point D, the anode of the diode $D_3$ being connected to point D, the cathode of the diode $D_3$ being connected to point C.

The close control may also comprise a first Zener diode $D_4$ and a second Zener diode $D_5$. The cathode of the first Zener diode $D_4$ is then connected to the point C. The anode of the first Zener diode $D_4$ is connected to the anode of the second Zener diode $D_5$. The cathode of the second Zener diode $D_5$ is connected to the point D.

The close control may comprise a capacitor $C_2$ connected between the point H and a point I, a capacitor $C_3$ connected between a point I and a point C, a diode $D_7$ connected between the point I and a point J. The anode of the diode $D_7$ is then connected to the point I, the cathode of the diode $D_7$ is connected to the point J. A resistor $R_1$ is connected between the point J and the point C, a diode $D_8$ is connected between the point J and the point D. The anode of the diode $D_8$ is then connected to the point D. The cathode of the diode $D_8$ is connected to the point J.

The advantages of the invention are notably that it allows high efficiency power supplies to be obtained. In addition, the duty cycle of the close control of converters can be chosen to differ from ½.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWINGS

Figure 1:
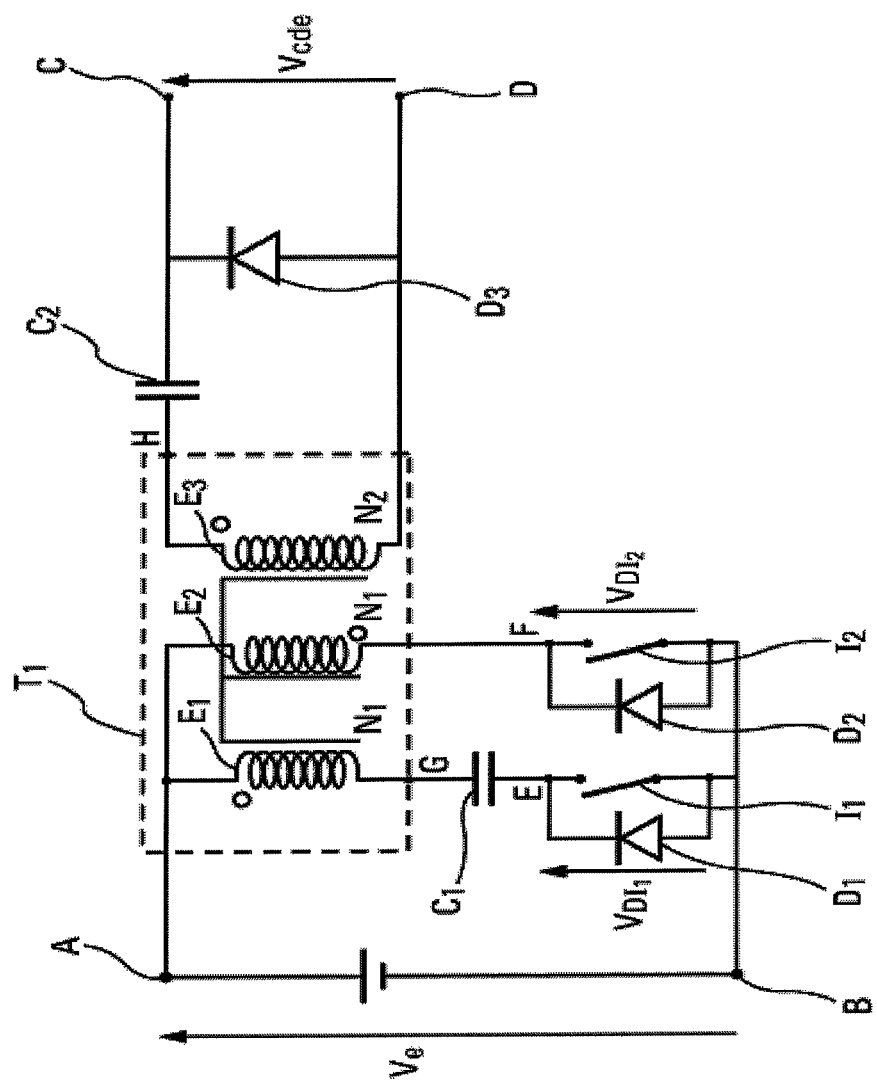
FIG. 1, a schematic diagram for a close control of converters according to the invention.

FIG. 1 shows a schematic diagram for a close control of converters according to the invention. The close control of converters according to the invention presented in FIG. 1 is an example of close control that can be used, for example, in isolated switched mode electric power supplies working at high frequency, (that is higher than one megahertz), with high efficiency (that is, more than 90%). Due to all these features, this type of power supply has a high level of integration relative to switched mode electrical power supplies working at lower frequency. The close control of converters according to the invention presented in FIG. 1 is particularly suited to being used to control a bridge converter working at a duty cycle of about ½. The close control of converters according to the invention is an isolated control, allowing energy stored in the control capacitor of voltage controlled switches currently used in power electronics to be recovered.

The close control of converters according to the invention receives a continuous input voltage $V_e$ between points A and B. The voltage $V_e$ may notably be provided by a voltage source. The close control of the converters provides an output voltage $V_{Cde}$ between points C and D. The voltage $V_{Cde}$ can then supply, for example, a bridge converter or any other converter.

An assembly comprising notably a diode $D_1$ and a switch $I_1$ is positioned between the point B and a point E. The diode $D_1$ and the switch $I_1$ are placed in parallel with each another. The anode of the diode $D_1$ is connected to point B while the cathode of the diode $D_1$ is connected to point E. The switch $I_1$ has a control function. The switch $I_1$ may, for example, be a MOS component or any other component playing the role of a switch. The voltage between the points E and B is denoted $V_{DI1}$.

An assembly comprising notably a diode $D_2$ and a switch $I_2$ is positioned between the point B and a point F. The diode $D_2$ and the switch $I_2$ are placed in parallel with each another. The anode of the diode $D_2$ is connected to point B while the cathode of the diode $D_2$ is connected to point F. The switch $I_2$ may, for example, be a MOS component or any other component playing the role of a switch. The switch $I_2$ has a control function. The voltage between the points F and B is denoted $V_{DI2}$.

The close control of converters according to the invention furthermore comprises a transformer $T_1$. The transformer $T_1$ provides a coupled inductance function. The transformer $T_1$ may be replaced by any component suited to this function. The transformer $T_1$ comprises notably a primary coil $E_1$ comprising a number $N_1$ of turns. The primary coil $E_1$ is connected between the point A and a point G. The transformer $T_1$ also comprises a primary coil $E_2$ comprising a number $N_1$ of turns. The primary coil $E_2$ is connected between the point A and the point F. The transformer $T_1$ comprises as many primary coils as switches ensuring a control function that is in phase or in phase opposition, namely two primary coils in the example shown in FIG. 1. The transformer $T_1$ also comprises a secondary coil $E_3$ comprising a number $N_2$ of turns. The transformer provides a voltage between a point H and the point D. The transformer ratio m of the transformer $T_1$ is equal to $N_2/N_1$. The transformer $T_1$ comprises as many secondary coils as there are switches to be controlled by means of the close control.

If a duty cycle different from ½ is desired, the transformer $T_1$ works with a magnetization cycle not centered on 0, implying a start of saturation and a higher level of iron losses. In this case, between the assembly comprising notably the diode $D_1$ and the switch $I_1$ and the primary coil $E_1$, that is between the points E and G, a capacitor $C_1$ is inserted. The function of the capacitor $C_1$ is notably to permit an adjustment of the duty cycle above or below 50%. By way of example, the duty cycle may be between 30% and 70%. In a steady state the charge of the capacitor $C_1$ ensures a magnetization cycle of the transformer $T_1$ which is symmetric around zero and thus brings the iron losses back to their lowest level. The presence of the capacitor $C_1$ minimizes the volume of the transformer $T_1$ and minimizes the losses.

In one embodiment, so as to minimize the losses, notably those linked with the resistances of the switches $I_1$ and $I_2$, the voltage excursion of the voltage $V_{Cde}$ may be limited and the voltage $V_{Cde}$ offset. In this case a capacitor $C_2$ may be positioned between the point H and the point C. In a steady state the capacitor $C_2$ charges to the chosen offset voltage. This voltage depends on the components chosen. A diode $D_3$ may be positioned between the point C and the point D. The anode of the diode $D_3$ is connected to point D, while the cathode of the diode $D_3$ is connected to point C. The diode $D_3$ suppresses the negative component. The maximum value of the voltage $V_{Cde}$ is denoted $V_{Cde\ max}$. The direct voltage $V_d$ of the diode $D_3$ is chosen so as to satisfy the following equation:

$$V_{Cde\ max} = V_e \cdot m - V_d.$$

In another embodiment, the diode $D_3$ is a Zener diode. The Zener diode then allows the control to be positively or negatively offset.

Figure 2:
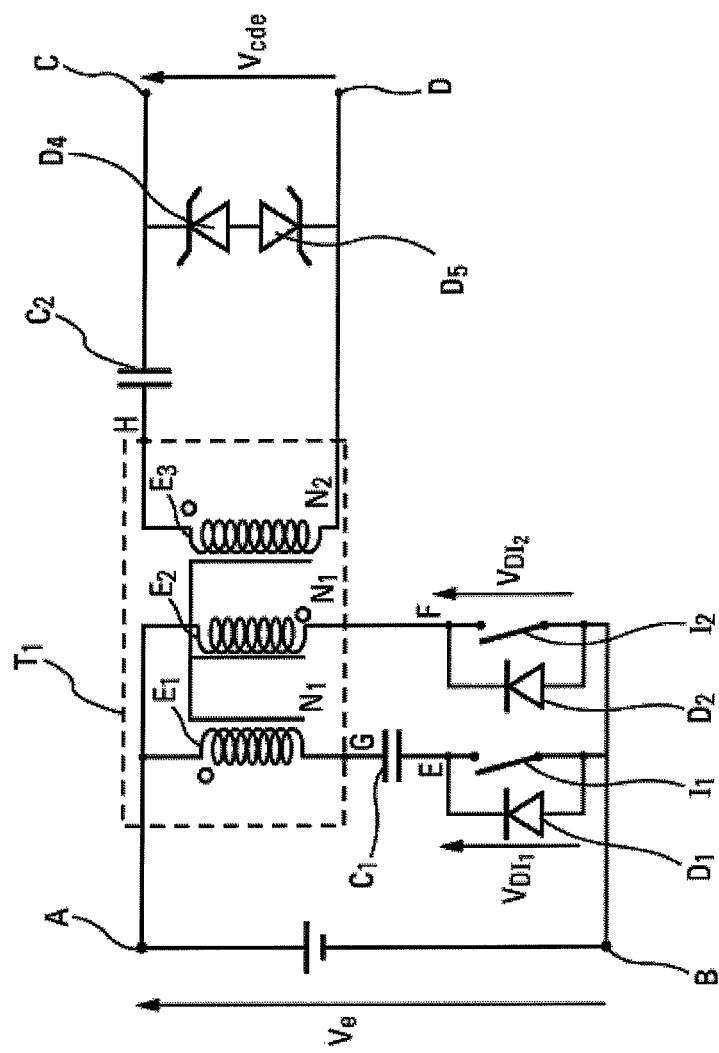
FIG. 2, a schematic diagram for a close control of converters according to another embodiment of the invention.

FIG. 2 illustrates a wiring diagram for a close control of converters according to another embodiment of the invention. Those elements which are identical to elements already presented in the other figures bear the same references. In another embodiment of the close control of converters according to the invention, the diode $D_3$ present in the diagram of FIG. 1 is replaced by two Zener diodes: a Zener diode $D_4$ and a Zener diode $D_5$. The cathode of the Zener diode $D_4$ is connected to point C. The anode of the diode $D_4$ is connected to the anode of the Zener diode $D_5$. The cathode of the Zender diode $D_5$ is connected to point D.

Figure 3:
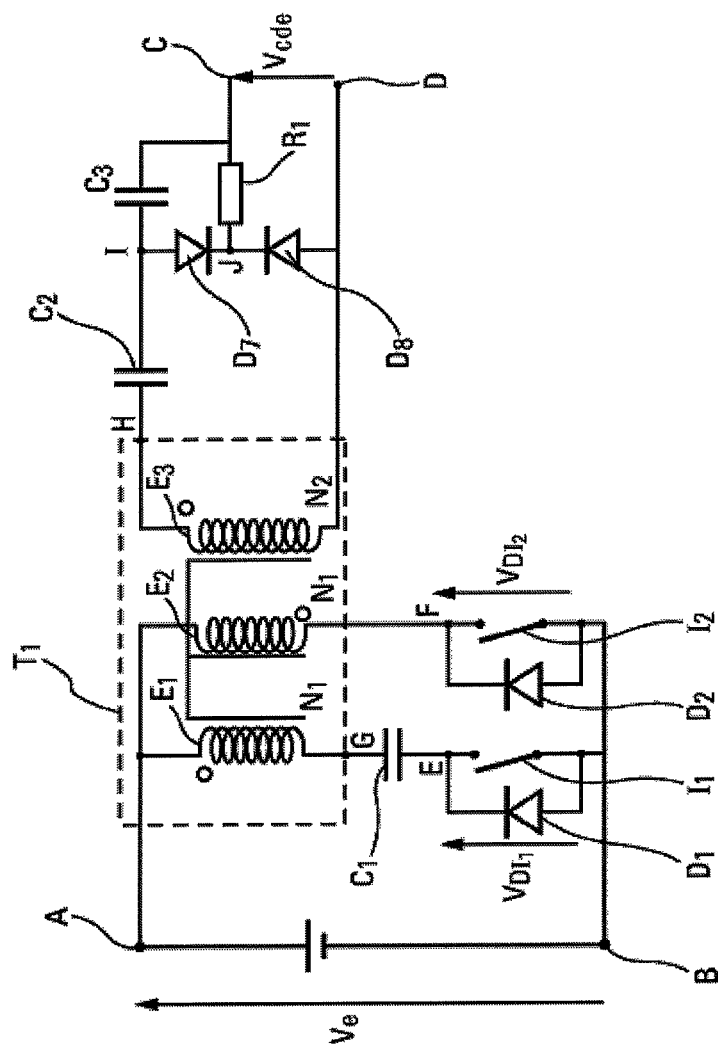
FIG. 3, a schematic diagram for a close control of converters according to another embodiment of the invention.

FIG. 3 illustrates a wiring diagram for a close control of converters according to another embodiment of the invention. Those elements which are identical to elements already presented in the other figures bear the same references. In another embodiment of the close control of converters according to the invention, the diode $D_3$ present in the diagram of FIG. 1 is omitted. The capacitor $C_2$ is connected between the point H and a point I. A capacitor $C_3$ is inserted between the points I and C. A diode $D_7$ is connected between the point I and a point J. The anode of the diode $D_7$ is connected to point I, while the cathode of the diode $D_7$ is connected to point J. A resistor $R_1$ is connected between the point J and the point C. A diode $D_8$ is connected between the point J and the point D. The anode of the diode $D_8$ is connected to point D, while the cathode of the diode $D_8$ is connected to point J.

Figure 4:
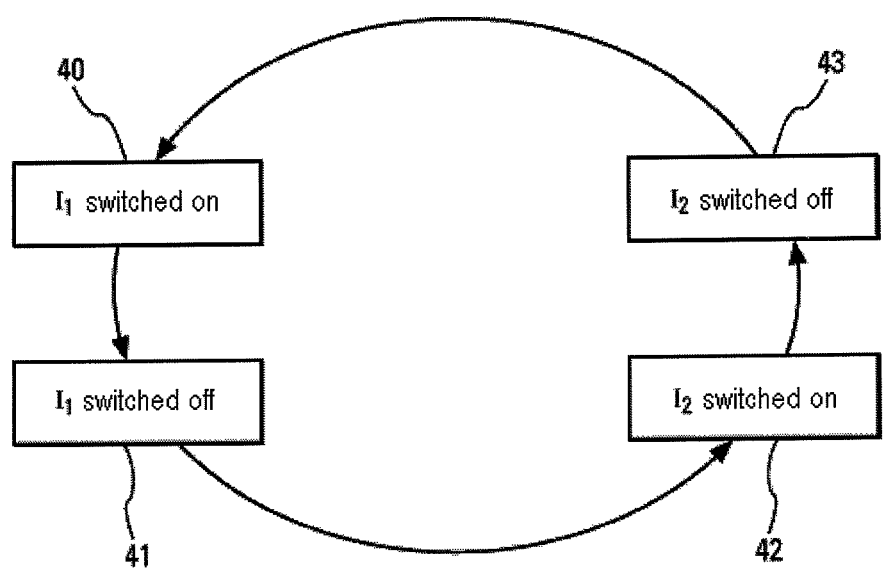
FIG. 4, the operating strategy of the switches according to the invention.

FIG. 4 illustrates the control strategy of the switches $I_1$ and $I_2$ according to the invention. Those elements which are identical to elements already presented in the other figures bear the same references. The control strategy of the switches $I_1$ and $I_2$ comprises notably four phases which can be cyclically repeated.

In a first stage 40, at a time $T_0$, the switch $I_1$ is switched on. Then in a second stage 41, at a time $T_1$, the switch $I_1$ is switched off. The diode $D_2$ then becomes conductive at a time denoted $T_2$. Before the current passing through the diode $D_2$ reaches zero, the switch $I_2$ is switched on in a stage 42. Then, at a time $T_3$, the switch $I_2$ is switched off in a stage 43. The diode $D_1$ then becomes conductive at a time marked $T_4$. The first stage 40 is then returned to.

Figure 5:
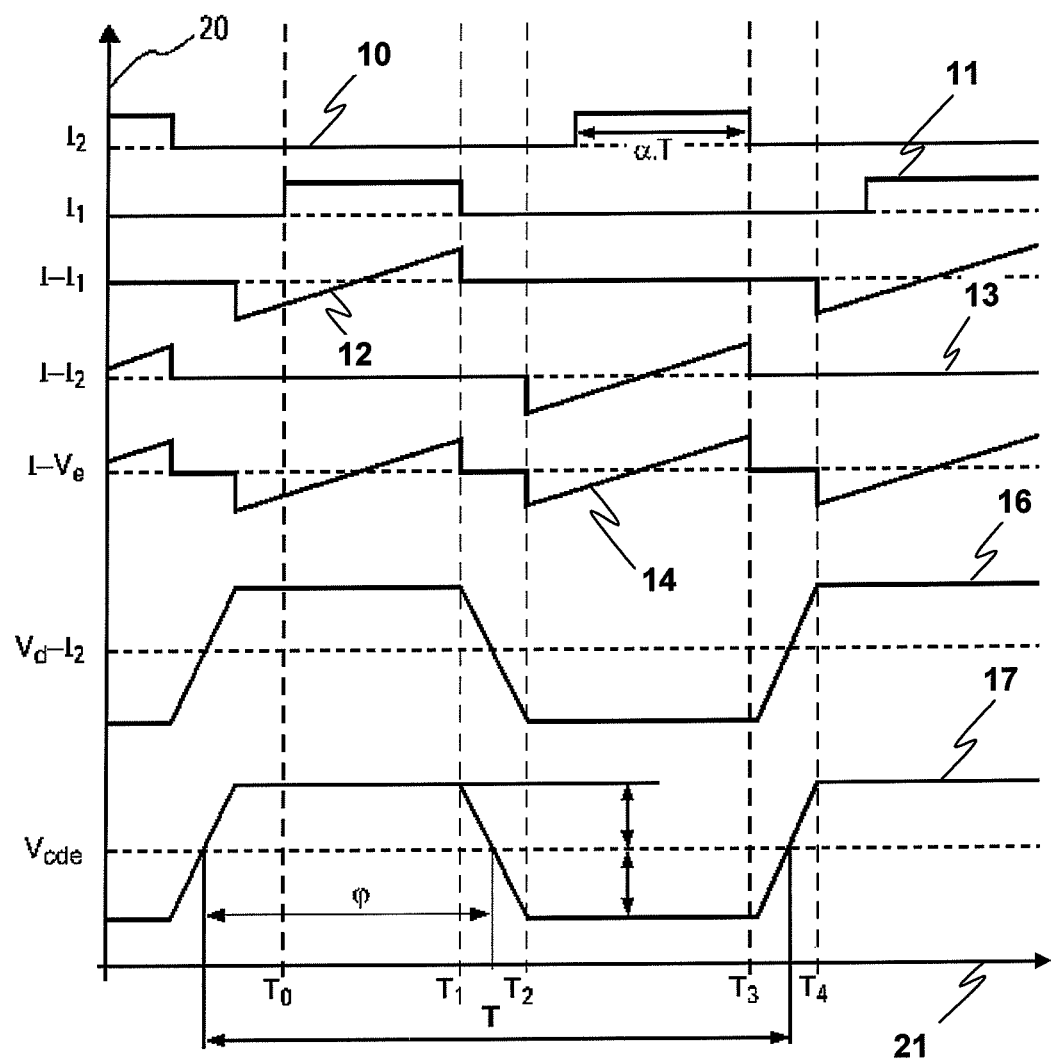
FIG. 5, the operating strategy of the switches $I_1$ and $I_2$ according to the invention, when applied to a close control of converters working with a duty cycle of ½ according to the invention.

FIG. 5 illustrates using timing diagrams and waveforms the control strategy of the switches $I_1$ and $I_2$ according to the invention, applied to a close control of converters working with a duty cycle of ½ according to the invention. Those elements which are identical to elements already presented in the other figures bear the same references. The x-axis 21 represents time. The following description of the functioning does not take account of the capacitors $C_1$ and $C_2$, the duty cycle in the example of FIG. 4 being strictly equal to 0.5. The current that flows in the assembly comprising the switch $I_1$ and the diode $D_1$ is marked $I\_I_1$. The current $I\_I_1$ is a function of time. The current that flows in the assembly comprising the switch $I_2$ and the diode $D_2$ is marked $I\_I_2$. The current $I\_I_2$ is a function of time. A curve 10 represents the control signal received by the switch $I_2$ as a function of time. A curve 11 represents the control signal received by the switch $I_1$ as a function of time. A curve 12 represents the current $I\_I_1$ as a function of time. A curve 13 represents the current $I\_I_2$ as a function of time. A curve 14 represents the current provided by the voltage source between the points A and B, marked $I\_V_E$, as a function of time. A curve 16 represents the voltage $V_{DI2}$. A curve 17 represents the voltage $V_{Cde}$.

At time $T_0$ the switch $I_1$ is switched on in the stage 40 of the control strategy of the switches $I_1$ and $I_2$ according to the invention. If the ratio $N_1/N_2$ is denoted m, the voltage $V_{Cde}$ is then equal to $V_e/m$. The switching of the switch $I_1$ is effected without loss (I.e. with zero switching voltage). The current $I\_I_1$ then increases linearly because a continuous voltage is applied to the magnetizing inductance terminals of the transformer $T_1$.

At time $T_1$ the switch $I_1$ is switched off in the stage 41 of the control strategy of the switches $I_1$ and $I_2$ according to the invention. At this time the current $I\_I_1$ has reached a maximum value denoted $I\_I_{1\,max}$. The magnetizing inductance of the transformer $T_1$ resonates with an equivalent capacitance Cg. The energy stored in the magnetizing inductance of the transformer $T_1$ is then transferred to the equivalent capacitance Cg. The voltage $V_{Cde}$ then decreases until it reaches the voltage $-V_e/m$, which causes the diode $D_2$ to become conductive.

At time T2, in a steady state to within thermal losses, the current $I\_I_2(T_2)$ is equal to the opposite of the current $I\_I_{1\,max}$. The current $I\_I_2$ then increases linearly because a continuous voltage is applied to the magnetizing inductance terminals of the transformer $T_1$. The switch $I_2$ is switched on during the stage 42 of the control strategy of the switches $I_1$ and $I_2$ according to the invention before the current in the diode $D_2$ reaches zero. When the diode $D_2$ is conducting, the voltage at the terminals of the switch $I_2$ being practically zero, the switching of $I_2$ is effected without loss.

At time $T_3$ the switch $I_2$ is switched off in the stage 43 of the control strategy of the switches $I_1$ and $I_2$ according to the invention. At this time $T_3$ the current $I\_I_2$ has reached a maximum value denoted $I\_I_{2max}$ equal to the current $I\_I_{1\,max}$. The magnetizing inductance of the transformer $T_1$ resonates with the equivalent capacitance Cg. The energy stored in the magnetizing inductance of the transformer $T_1$ is then transferred to the equivalent capacitance Cg. The voltage $V_{Cde}$ then increases until it reaches the voltage $V_e/m$, which causes the diode $D_1$ to become conductive.

At time $T_4$, when the diode $D_1$ become conductive, in a steady state to within thermal losses, the current $I\_I_1$ is equal to the opposite of the current $I\_I_{1\,max}$. The current $I\_I_1$ then increases linearly because a continuous voltage is applied to the magnetizing inductance terminals of the transformer $T_1$. It is then possible, before the current $I\_I_1(t)$ reaches zero, to return to stage 40 of the control strategy of the switches $I_1$ and $I_2$ according to the invention.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A close control comprising:
   a control voltage ($V_{Cde}$) to at least one electric power converter,
   a continuous input voltage ($V_e$) between a point A and a point B,
   a first diode in parallel with a first switch, an anode of the first diode being connected to point B, a cathode of the said diode being connected to a point E;
   a second diode in parallel with a second switch, an anode of the second diode being connected to point B, a cathode of the said second diode being connected to a point F;
   a transformer comprising a first primary coil connected between point A and a point G, a second primary coil connected between point A and the point F, and a secondary coil, said transformer providing a voltage between a point H and a point D, wherein a number of turns of the first primary coil is equal to the number of turns of the second primary coil, wherein the point E is connected to the point G by a first capacitor;
   a second capacitor connected between point H and a point I,
   a third capacitor connected between said point I and point C,
   a third diode connected between point I and a point J, the anode of the third diode being connected to point I, the cathode of said third diode being connected to said point J,
   a resistor connected between point J and point C,
   a fourth diode connected between point J and point D, the anode of the fourth diode being connected to the point D, the cathode of the fourth diode being connected to the point J,
   point E and point G being electrically connected to one another, as well as point H and a point C, the first and second switches being controlled according to a cyclic sequence comprising the following stages:
   at a time $T_0$ the first switch is switched on;
   at a time $T_1$ the first switch is switched off;
   the second switch is switched on before the current passing through the second diode reaches zero;
   at a time $T_3$ the second switch is switched off; and
   at a time $T_4$, when the first diode becomes conductive, the first stage is returned to.

2. The close control as claimed in claim 1, wherein the point H is connected to point C by a second capacitor.

3. The close control as claimed in claim 1, wherein the point H is connected to point C by a second capacitor.

4. The close control as claimed in claim 3, wherein a third diode is connected between the point C and the point D, the anode of the third diode being connected to point D, the cathode of the third diode being connected to point C.

5. The close control as claimed in claim 3, further comprising a first Zener diode and a second Zener diode, the cathode of said first Zener diode being connected to the point C its anode being connected to the anode of said second Zener diode, the cathode of said second Zener diode being connected to the point D.

6. A close control comprising:
   a control voltage ($V_{Cde}$) to at least one electric power converter,
   a continuous input voltage ($V_e$) between a point A and a point B,
   a first diode in parallel with a first switch, an anode of the first diode being connected to point B, a cathode of the said diode being connected to a point E;
   a second diode in parallel with a second switch, an anode of the second diode being connected to point B, a cathode of the said second diode being connected to a point F;
   a transformer comprising a first primary coil connected between point A and a point G, a second primary coil connected between point A and the point F, and a secondary coil, said transformer providing a voltage between a point H and a point D, wherein a number of turns of the first primary coil is equal to the number of turns of the second primary coil, wherein the point E is connected to the point G by a first capacitor, and the point H is connected to point C by a second capacitor; and
   a first Zener diode and a second Zener diode, the cathode of said first Zener diode being connected to the point C its anode being connected to the anode of said second Zener diode, the cathode of said second Zener diode being connected to the point D, wherein
   point E and point G being electrically connected to one another, as well as point H and a point C, the first and second switches being controlled according to a cyclic sequence comprising the following stages:
   at a time $T_0$ the first switch is switched on;
   at a time $T_1$ the first switch is switched off;
   the second switch is switched on before the current passing through the second diode reaches zero;
   at a time $T_3$ the second switch is switched off; and
   at a time $T_4$, when the first diode becomes conductive, the first stage is returned to.

* * * * *